United States Patent

[11] 3,585,465

[72] Inventor William Paul Imhauser
Somerville, N.J.
[21] Appl. No. 13,026
[22] Filed Feb. 20, 1970
[45] Patented June 15, 1971
[73] Assignee RCA Corporation

[54] MICROWAVE POWER TRANSISTOR WITH A BASE REGION HAVING LOW-AND-HIGH-CONDUCTIVITY PORTIONS
6 Claims, 4 Drawing Figs.

[52] U.S. Cl. .......... 317/235R,
317/234R, 317/234N, 317/234V, 317/235, 317/235Z, 317/235AM
[51] Int. Cl. .......... H02l 5/00
[50] Field of Search .......... 317/234, 5, 5.4, 9, 40.13, 48.1

[56] References Cited

UNITED STATES PATENTS

| | | | |
|---|---|---|---|
| 3,336,508 | 8/1967 | Preletz et al. | 317/101 |
| 3,500,143 | 3/1970 | Lamming | 317/235 |
| 3,453,503 | 7/1969 | Schulz et al. | 317/235 |
| 3,368,123 | 2/1968 | Rittman | 317/235 |
| 3,287,610 | 11/1966 | Reber | 317/235 |

*Primary Examiner*—John W. Huckert
*Assistant Examiner*—B. Estrin
*Attorney*—Glenn H. Bruestle

ABSTRACT: The device includes a plurality of oblong base lobes radially disposed about a central collector portion, with a thin emitter region centrally diffused within each oblong base lobe. The base region of each device also includes a high conductivity region comprising an outer peripheral ring around the lobes and wedge-shaped portions which taper inward towards the central portion and between adjacent oblong base lobes, providing good current injection uniformity along the emitter-base junction. Emitter interconnection is made by means of a metal film disposed over an oxide layer having apertures exposing the emitter region; base interconnection is made by means of a metal ring disposed around the outer peripheral ring of the high conductivity region.

PATENTED JUN 15 1971 3,585,465

SHEET 1 OF 2

INVENTOR.
William P. Imhauser
BY
Glenn H. Bruestle
ATTORNEY

INVENTOR.
William P. Imhauser
BY
Glenn H. Bruestle
ATTORNEY

MICROWAVE POWER TRANSISTOR WITH A BASE REGION HAVING LOW-AND-HIGH-CONDUCTIVITY PORTIONS

BACKGROUND OF THE INVENTION

The invention herein disclosed was made in the course of or under contract or subcontract thereunder with the Department of the Air Force.

The present invention relates to semiconductor devices, and relates in particular to transistors having semiconducting regions and metal contacts designed to improve current handling and frequency characteristics for UHF and microwave applications.

It is known in the semiconductor art that the power and frequency capabilities of a transistor may be increased by breaking up the active emitter region into a plurality of smaller regions, in order to increase the numerical ratio between the emitter periphery and the base area, and to enhance the thermal dissipation characteristics of the device. In applying this concept, several device diffusion profiles and geometries have been employed; many of which are initially designed to increase the power capability for standard frequency operation in the HF range. One such device utilizes an interdigitated array of emitter and base regions. Another transistor, which is designed for VHF and UHF operation, employs a plurality of independent emitter and base regions disposed in radial alignment around the center of the wafer. An example of such a device is described in U.S. Pat. No. 3,336,508. The above-described devices represent an improvement in terms of the emitter periphery to base area ratio; however, other important parameters, such as current injection uniformity and thermal dissipation ability remain low for such devices at microwave frequencies.

Current injection uniformity is a measure of the uniformity of the current injected across the emitter-base junction at all points along the junction, and is a function of both the cross-sectional area of the conducting material at the point, and the distance between that point and the base contact.

Another multiple-emitter device, having good current injection uniformity, utilizes a grid arrangement of emitter and base regions, with adjacent base regions and base contacts separated by a high conductivity region of the same conductivity type as each base region. This high conductivity region improves the current injection along the portion of the emitter-base junction which lies between interdigitated base contacts. The device, called the "Overlay" transistor, is described in U.S. Pat. No. 3,434,019, which is assigned to the assignee of the present invention.

Developments in the art, such as those described above, have solved some of the problems associated with the operation of transistors at power levels of 1.0—100.0 watts in the VHF and UHF frequency ranges. However, with the smaller dimensions of the emitter and base elements and the smaller alignment tolerances which are necessary for devices designed for operation at microwave frequencies at power levels of 1.0 watt and above, other techniques are required to optimize injection uniformity and thermal dissipation.

SUMMARY OF THE INVENTION

The present invention comprises a semiconductor device formed in a crystalline semiconductor body having a major surface with a central portion thereon. The device includes a collector region of a first conductivity type having a hub including the central portion of the surface, and an annular base region of a second conductivity type disposed adjacent the collector region and around the hub.

The device also includes a plurality of rectangular first conductivity type emitter regions disposed in a radial direction in the annular base region, and means for making ohmic contact to the collector region, the base region, and the emitter regions.

THE DRAWING

Figure 1:
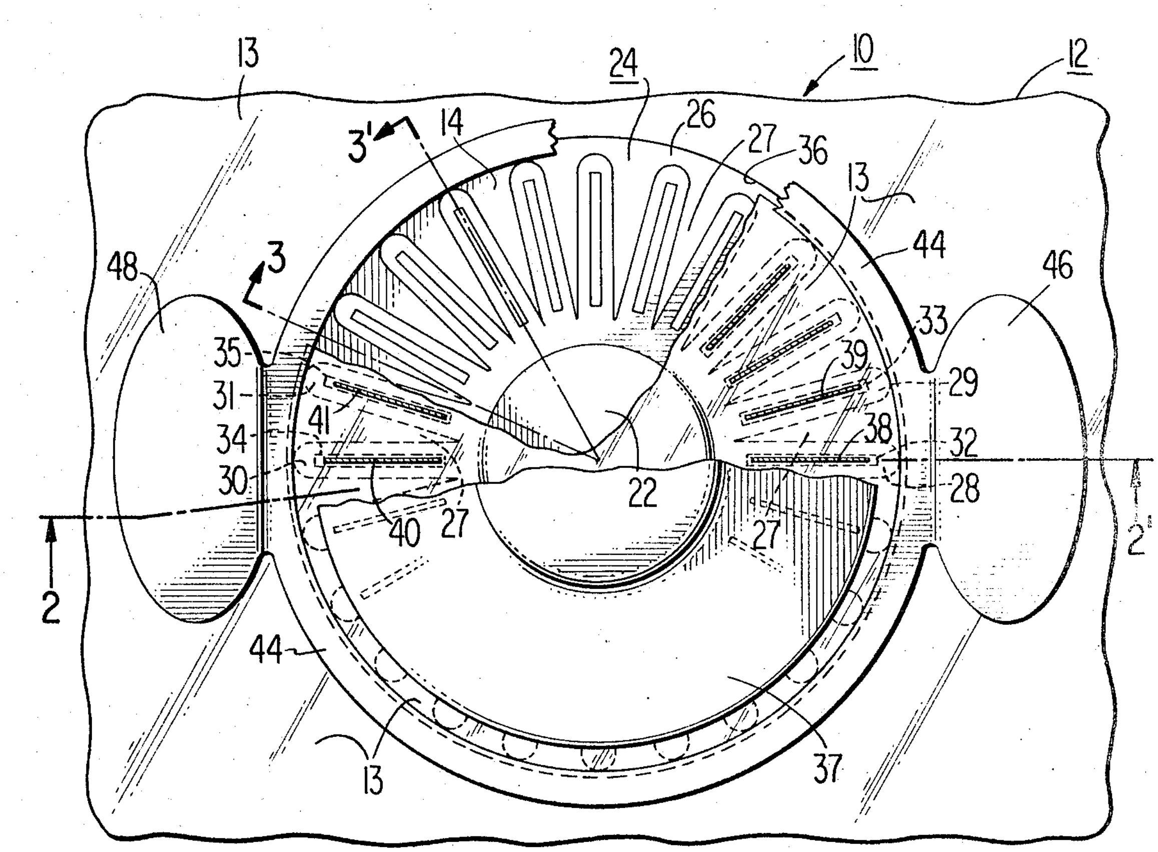
FIG. 1 is a top plan view of a microwave power transistor constructed in accordance with the present invention, with a portion of the device cut away.
Figure 3A:
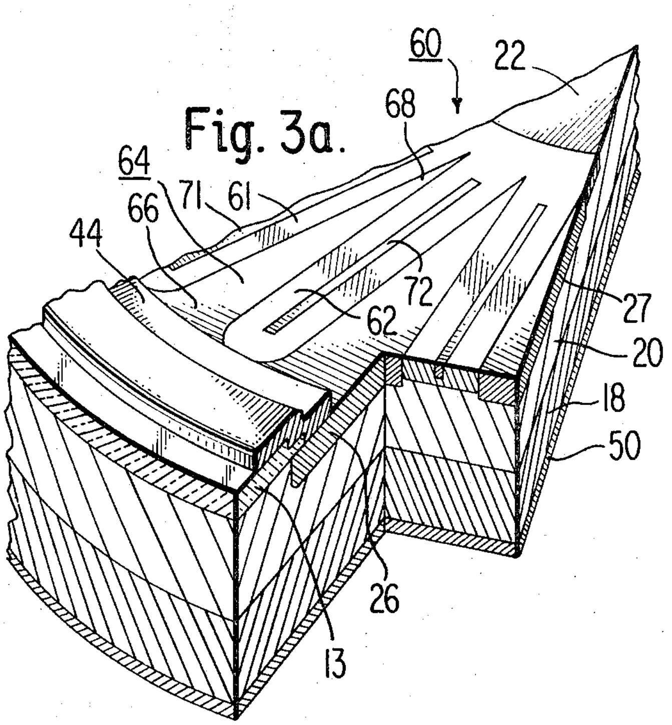

FIG. 3*a* is a perspective view of a wedge-shaped portion of the transistor in FIG. 1, taken along the lines 3—3'.

Figure 4:
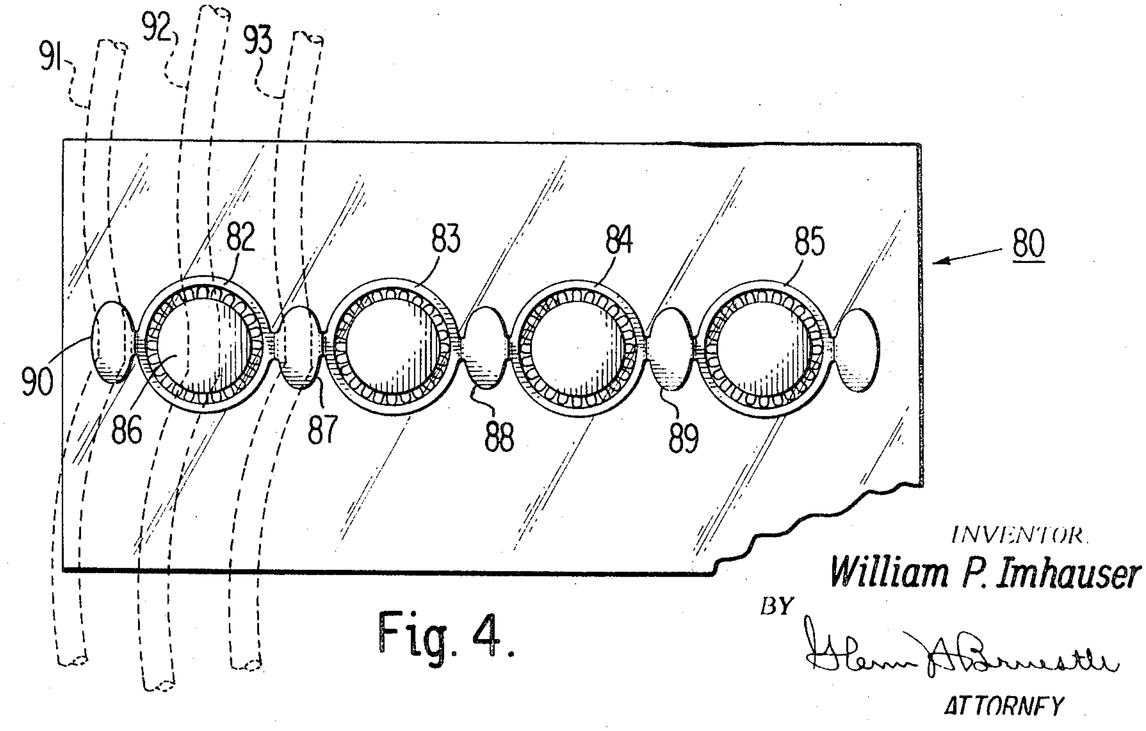

FIG. 4 is a top plan view of a multiple-cell transistor constructed in accordance with the present invention.

DETAILED DESCRIPTION

A preferred embodiment of the microwave power transistor will now be described with reference to FIGS. 1 and 2.

The transistor includes a collector, a complex emitter and base profile, and means for making ohmic contact to the regions. Noting FIGS. 1 and 2, the transistor 10 comprises a crystalline semiconductor body 12 having a top major surface 14, with an insulating layer 13 disposed over a portion of the surface. While the size, shape, composition and conductivity of the semiconductor body 12 is not critical, it preferably comprises a silicon wafer about 14.0 mils square, and 4.5 mils in thickness. The insulating layer 13 preferably comprises a silicon dioxide layer about 12,000 A thick.

Figure 2:
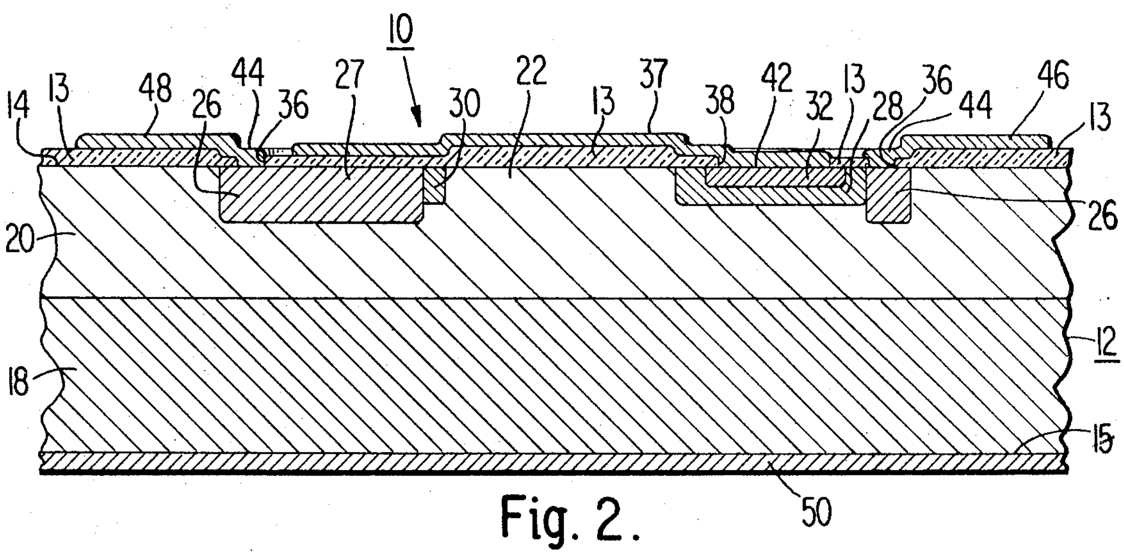
FIG. 2 is a cross-sectional view of the transistor in FIG. 1, taken along the line 2—2'.

Noting FIG. 2, the transistor 10 also includes a low resistivity N conductivity substrate region 18 comprising the lower portion of the semiconductor body 12, and a high resistivity N conductivity collector region 20 adjacent the N+ substrate region 18. The N collector region 20 includes a hub 22 which extends to the top surface 14 of the silicon body 12; the hub 22 includes a central portion of the surface 14. The thickness of the collector region 20 is preferably about 0.25 mils, as measured through the hub 22 from the top surface 14. The thickness of the N+ substrate 18 is equal to the remaining thickness of the silicon body 12.

The transistor 10 includes an annular P-type conductivity base region 24 adjacent the collector region 20, and around the hub 22. The base region 24 also comprises a plurality of oblong high resistivity lobes extending radially outward from the hub portion 22 of the collector region 20, and a high conductivity P+ region intermediate to the lobes. Four of the high resistivity oblong lobes are numbered 28—31 in FIGS. 1 and 2. The P+ region comprises an outer peripheral ring 26 and a plurality of wedge-shaped region 27, which taper inward toward the central hub portion 22 and between adjacent oblong lobes.

The number of oblong lobes employed in the base region 24 of the transistor 10 is dependent upon the number of emitter sites employed which in turn, is dependent on the amount of emitter current the device is required to conduct. In this embodiment, 24 base lobes, including lobes 28—31, are employed as illustrated in FIG. 1. The depth of each portion of the base region below the top surface 14 of the semiconductor body 12 is dependent upon the maximum frequency of operation contemplated. In the preferred embodiment, the high resistivity oblong lobes, including lobes 28—31, suitably extend to a depth of between 0.02 to 0.04 mils, and the high conductivity P+ region, including the outer peripheral ring 26 and the wedge-shaped regions 27, extends to a depth of between 0.05 and 0.10 mils below the top surface 14.

The diffusion profile of the transistor 10 is completed with a plurality of elongated separate N-type emitter regions, with each emitter region centrally disposed in one of the oblong base lobes. Four of the emitter regions are numbered 32—35 in FIG. 1, and are disposed in oblong base lobes 28—31, respectively. Suitably, each emitter region, including emitter regions 32—35, is 1.0 mil long in the radial direction, 0.04 mils in width, and extends to a depth of 0.02 mils below the top surface 14 of the silicon body 12.

The insulating layer 13 is also disposed over that part of the top surface 14 which extends to the outer edge of the oblong base lobes, including lobes 28—31. In FIG. 1, a portion of the layer is cut away. This inner portion of the insulating layer 13 has a plurality of emitter contact apertures extending through the layer, with each aperture exposing an emitter region at the top surface 14. Four of the apertures are numbered 38—41 in FIGS. 1 and 2, and expose emitter regions 32—35, respectively.

A metal emitter contact 37 overlays a portion of the insulating layer 13, and makes direct ohmic contact through the apertures to each emitter region at the top surface 14. In FIG. 1, part of the emitter contact 37 is cut away. Noting FIG. 2, one of the emitter contact surfaces is numbered 42 and is shown making direct contact to emitter region 32. The emitter contact 37 preferably comprises an aluminum film about 20,000 A thick.

Ohmic base contact is provided by means of a metal contact ring 44, and a pair of base bond pads 46 and 48. The contact ring 44 is disposed so as to make direct contact to the outer peripheral P+ ring 26 at top surface 14 through an aperture 36, which is defined by the outer edge of the inner portion, and the inner edge of the outer portion, of the insulating layer 13. The base bond pads 46 and 48 are contiguous to the contact ring 44 at opposing points on the outer periphery of the ring, and overlay a portion of the insulating layer 13. The ring 44 and bond pads 46 and 48 suitably comprise a film of aluminum about 20,000 A thick. The ring 44 is preferably about 0.3 mils wide.

The transistor 10 also includes a collector contact 50, which preferably comprises a layer of aluminum disposed on a lower surface 15 of the silicon body 12; suitably, the contact 50 is between 2000 A to 3000 A thick.

The preferred embodiment of the transistor 10 is fabricated in the following manner. The starting semiconductor material preferably comprises a highly doped N conductivity silicon wafer, having a resistivity of about 0.015 $\Omega \cdot .cm^{11}$. While it is feasible by standard diffusion methods to prepare a wafer having both the N+ substrate region 18 and the N collector region 20 diffused within the semiconductor body, it is preferred to start with an N+ wafer as described above, and epitaxially grow the high resistivity N collector region 20 on the N+ substrate 18. Suitably, the silicon epitaxial layer is about 0.25 mils thick and has a resistivity of about 1.0 ohm-cm. The epitaxial growth method is known in the art, and is not described herein.

A silicon dioxide layer about 5000 A thick is then thermally grown over the entire top surface 14 of the epitaxial collector region 20. The surface is treated with a suitable photoresist, masked, and the photoresist is exposed and developed, to leave unprotected the outer peripheral P+ ring 26 and the wedge-shaped regions 27. The silicon wafer is then treated with an etchant to remove the oxide from the unprotected areas. Thereafter, the wafer is placed in a diffusion furnace and treated with a P-type doping impurity, such as boron nitride, so as to diffuse the high conductivity P+ region through the unprotected portion of the top surface 14 of the wafer. The remaining oxide layer is then stripped from the surface of the transistor, and another oxide layer is thermally grown in the diffusion furnace. The final diffusion depth depends on the desired range of frequency operation; for VHF and UHF operation, the depth is preferably about 0.15 mil. For microwave frequencies, the diffusion depth is preferably about 0.05 mil.

Another oxide layer is deposited by treating the surface with silane gas in an oxidizing atmosphere. The second oxide layer is treated with a suitable photoresist, masked, exposed and developed, and etched to leave unprotected the entire base ring 24. Thus, the oblong base lobes are no longer protected with an oxide layer and photoresist. The wafer is again placed in a diffusion furnace and treated with a P-type dopant, such as boron nitride, so as to diffuse a low concentration of P-type impurities into the base ring 24. Since the high conductivity ring 26 and wedges 27 have been earlier doped P+, the effect of the second P diffusion in this portion is negligible; thus, only the oblong lobes, including lobes 28—31, obtain a low concentration of P-type impurities. The depth of this low concentration P diffusion into the base lobes is also dependent on the frequency at which the device is to operate. For VHF and UHF frequencies, a diffusion depth of about 0.08 mil is preferred. For microwave frequencies, a depth of between 0.02 to 0.04 mil is preferred.

The boron glass layer formed in the deposition stage of the diffusion is stripped away, and an additional thermal oxide layer is grown during the last stage of the diffusion. A third photoresist layer is applied to the top surface 14. The surface is then masked with a pattern containing the emitter sites, and the photoresist is exposed and developed. The layer is then treated with a suitable etchant, leaving the emitter sites exposed at the top surface 14. Thereafter, the wafer is placed in a diffusion furnace and treated with an N-type doping impurity, such as a solution of phosphorus, to diffuse an N-type region into each emitter site to a depth of about 0.02 mil below the top surface 14.

During the emitter diffusion step, a thin layer of phosphorus glass is formed over the previously exposed emitter sites. In order to expose the emitter sites, the wafer is placed in an oxide etch for about 10 seconds. A fourth photoresist layer is applied to the top surface 14. The surface is then masked with a pattern containing the base contact aperture 36 and the photoresist is exposed and developed. The oxide layer 13 is then removed to expose the outer peripheral P+ ring 26 in the aperture 36. Thereafter, an aluminum film of about 20,000 A thickness is deposited by known methods over the exposed portions of the top surface of the wafer, and the remaining oxide layer 13. The metallization is then treated with photoresist, masked, exposed and developed, to leave metal in the emitter regions, the base contact ring 44, the base bond pads 46 and 48 and the emitter contact 37. The surface is then etched to remove all other areas of metallization.

A transistor constructed in accordance with the above-described embodiment provides the following advantages.

First, the emitter-base geometry of the transistor provides an excellent numerical ratio between the emitter periphery and the base area.

Second, the transistor provided excellent current injection uniformity along the emitter-base junction. The manner in which current injection uniformity is improved will be described with reference to FIG. 3*a*, which is a perspective view of a wedge-shaped section 60 of the transistor, with the inner portion of the oxide layer 13 and the emitter contact 37 removed.

Noting FIG. 3*a*, two of the high resistivity P-type base lobes 61 and 62 are separated by a wedge-shaped high conductivity P+ region 64. The wedge-shaped region 64 serves as a conductive path of base current from the base contact ring 44 along the periphery of the oblong base lobes 61 and 62. The current injecting uniformity is improved along the emitter-base junction because the wedge-shaped high conductivity P+ region 64 provides lower resistance (greater cross section) in the high current area 66 adjacent the base contact 44, and higher resistance (smaller cross section) in the lower current area 68 further from the base contact 44. Thus, the voltage drop down the radial periphery of the oblong base lobes 61 and 62 is more linear than was previously possible. For example, it has been determined that approximately twice the current is injected in the low current area 68 using the wedge-shaped P+ region, than with a rectangular grid of the width required to achieve the same emitter periphery to base area design ratio.

Another advantage of the transistor accrues from the ease with which the device may be employed in a multiple cell device. Parallel multiple cell devices may be utilized when increased power capacity is required. FIG. 4 is a multiple cell transistor 80 employing four parallel units 82—85 of the preferred embodiment. The dotted lines 91—93 over unit 82 represent emitter and base lead connections, which will hereinafter be described.

The four-cell transistor 80 may be fabricated by using the masking steps described previously, and photorepeater piecing techniques well known in the art. Parallel connection of the base contact is made by overlapping the base bond pads 87—89.

Further, the placement of emitter contact metallization in the center of the transistor provides excellent heat dissipation capacity, and allows a significant reduction of the parasitic lead inductance with respect to conventional rectangular emitter contact fingers used in prior art devices. Noting FIG. 4, an emitter lead 92 (represented by a dotted line) is bonded to the emitter contact 86 of unit 82. The lead 92 preferably comprises aluminum wire of approximately 1.0 mil in diameter. The emitter metallization 86 is about 2.5 mils in diameter, when fabricated in accordance with the preferred embodiment. Therefore, when the emitter lead 92 is bonded to the emitter contact 86, the lead 92 overlies approximately 40 percent of the total emitter area, and thus serves as an excellent heat dissipation path for the emitters.

Suitable base lead connection is made to the base bond pads by means of similar 1.0 mil aluminum wire. Noting FIG. 4, two base leads 91 and 93 (represented by dotted lines) are shown bonded to bond pads 90 and 87, respectively. In addition, the lead connections described above are compatible with existing coaxial and strip line packaging techniques.

The transistor may also be employed in a "flip-chip" package; that is, with the emitter down. Further emitter-to-base isolating is possible in a "flip-chip" arrangement by increasing the thickness of the emitter metallization, and indexing the emitter and base contacts to the package at two different levels.

It will be appreciated by those skilled in the semiconductor art that other embodiments are possible within the scope of the present invention For example, while an NPN device has been described above, a PNP device is also feasible.

I claim:

1. A semiconductor device comprising:
   - a crystalline semiconductor body with a major surface having a central portion thereon;
   - a first conductivity type collector region having a hub including the central portion of the surface;
   - an annular base region of a second conductivity type disposed adjacent said collector region and around the hub, said base region comprising:
     - a high resistivity region comprising an inner peripheral ring surrounding said hub and a plurality of oblong lobes radially extending from said inner ring;
     - a high conductivity region comprising an outer peripheral ring and a plurality of wedge-shaped regions tapering inward toward the hub and between adjacent oblong lobes;
   - a plurality of first conductivity type emitter regions, each centrally disposed in one of the oblong lobes; and
   - means for making ohmic contact to said collector region, said emitter regions, and said base region.

2. A semiconductor device according to claim 1, in which the high resistivity base lobes are disposed between 0.02 to 0.08 mil below said surface.

3. A semiconductor device according to claim 1, in which the high conductivity base region is disposed between 0.05 to 0.15 below the surface.

4. A semiconductor device according to claim 1, in which the means for making ohmic contact to said emitter region comprises:
   - an insulating layer disposed over the surface;
   - the layer having a plurality of apertures, each aperture exposing a portion of the surface at an emitter region; and
   - a metallic film disposed over the layer, said film making ohmic contact to said emitter regions through the apertures.

5. A semiconductor device according to claim 1, in which the means for making ohmic contact to said base region comprises:
   - a metal ring disposed on the outer peripheral ring of said high conductivity base region; and
   - a pair of opposing bond pads disposed contiguous with the outer periphery of the metal ring.

6. A transistor comprising:
   - a crystalline semiconductor body having a major surface with an insulating layer disposed over a portion of the surface;
   - a first conductivity type collector region having a plurality of hubs extending to the surface and spaced a predetermined distance apart;
   - a plurality of annular base regions of a second conductivity type disposed adjacent said collector region, each said annular base region disposed around one of the hubs, and comprising
     - a high resistivity region comprising an inner peripheral ring surrounding each said hub and a plurality of oblong lobes radially extending from said inner ring;
     - a high conductivity region comprising an outer peripheral ring and a plurality of wedge-shaped regions tapering inward toward the hub portion and between adjacent oblong lobes;
   - a plurality of first conductivity type emitter regions, each centrally disposed in one of the oblong lobes; and
   - means for making ohmic contact to said collector region, said emitter regions, and said base regions.